United States Patent
Lindsey et al.

(10) Patent No.: US 9,234,931 B2
(45) Date of Patent: Jan. 12, 2016

(54) FAULT DETECTION SYSTEM WITH LEAKAGE CURRENT DETECTION

(71) Applicant: CATERPILLAR INC., Peoria, IL (US)

(72) Inventors: Robert W. Lindsey, Washington, IL (US); Daniel D. Podany, Peoria, IL (US); Sangameshwar Sonth, Peoria, IL (US); Thomas M. Sopko, East Peoria, IL (US); Richard G. Auch, Peoria, IL (US); Jason Miller, Princeville, IL (US)

(73) Assignee: Caterpillar Inc., Peoria, IL (US)

( * ) Notice: Subject to any disclaimer, the term of this patent is extended or adjusted under 35 U.S.C. 154(b) by 413 days.

(21) Appl. No.: 13/790,906

(22) Filed: Mar. 8, 2013

(65) Prior Publication Data

US 2014/0253139 A1    Sep. 11, 2014

(51) Int. Cl.
*H02H 9/00* (2006.01)
*E01C 23/14* (2006.01)
(Continued)

(52) U.S. Cl.
CPC .............. *G01R 31/025* (2013.01); *E01C 19/22* (2013.01); *E01C 2301/10* (2013.01); *G01R 31/006* (2013.01)

(58) Field of Classification Search
CPC ..... G01R 31/025; G01R 31/343; G01R 31/34
USPC ................. 324/510, 500, 509, 512, 528, 531, 324/765.01, 555, 772
See application file for complete search history.

(56) References Cited

U.S. PATENT DOCUMENTS 5,381,081 A * 1/1995 Radun ....................... H02P 9/40
                                                                    318/696
6,127,747 A   10/2000 Halvorson
(Continued)

FOREIGN PATENT DOCUMENTS

JP    2008128837    6/2008
WO    2009048619    10/2008

OTHER PUBLICATIONS

Wikipedia, "Multimeter", website. Retrieved from the internet Oct. 6, 2014, <http:en.wikipedia.org/wiki/multimeter>, 20 pages.

*Primary Examiner* — Patrick Assouad
*Assistant Examiner* — Taqi Nasir
(74) *Attorney, Agent, or Firm* — Finnegan, Henderson, Farabow, Garrett & Dunner, LLP

(57) ABSTRACT

A fault detection system for a machine having a plurality of electrical conducting elements insulated from a frame ground of the machine is disclosed. The fault detection system may include a high voltage DC power source, a positive high voltage bus connected to a positive terminal of the high voltage DC power source and providing high voltage electrical power to the plurality of electrical conducting elements, and a negative high voltage bus connected to a negative terminal of the high voltage DC power source and returning high voltage electrical power from the plurality of electrical conducting elements. At least one of the positive and negative high voltage buses may be selectively connected through a plurality of switches to plural zones of the electrical conducting elements, with each of the plural zones being electrically connected in parallel, and selectively connected to the high voltage DC power source by one of the plurality of switches. A low voltage DC power source may be configured to form part of a leakage current detector selectively connected through each of the plurality of switches to each of the plural zones for detecting leakage current between an electrical conducting element and the frame ground.

17 Claims, 6 Drawing Sheets

(51) Int. Cl.
 G01R 31/02 (2006.01)
 E01C 19/22 (2006.01)
 G01R 31/00 (2006.01)

(56) References Cited

U.S. PATENT DOCUMENTS

| | | |
|---|---|---|
| 8,177,305 B2 | 5/2012 | Burns et al. |
| 8,258,442 B2 | 9/2012 | Miller et al. |
| 8,308,395 B2 | 11/2012 | Jurasz et al. |
| 8,636,442 B1* | 1/2014 | Sopko, Jr. ............... E01C 19/48 404/118 |
| 2008/0158756 A1* | 7/2008 | Lindsey ............... B60L 3/0023 361/88 |
| 2009/0085575 A1* | 4/2009 | Lindsey ............... G01R 31/025 324/510 |

\* cited by examiner

FAULT DETECTION SYSTEM WITH LEAKAGE CURRENT DETECTION

TECHNICAL FIELD

This disclosure relates generally to a fault detection system and, more particularly, to a fault detection system with leakage current detection.

BACKGROUND

An example of a machine with multiple electrical conductors that may need to be tested for electrical faults such as unacceptable current leakage is a paving machine. Typical paving machines include a tractor for providing mobility and power, a hopper containing a supply of a bituminous aggregated mixture or asphalt, and a screed which lays the asphalt paving material onto an area to be paved in a strip of uniform thickness. The tractor typically includes a combustion engine configured to power operations of the paving machine, and the engine may be any of a variety of known power plants that may include gas turbine engines, natural gas powered engines, diesel engines, and gasoline engines. The asphalt paving material is heated and is applied when it has a plastic consistency so that it may be easily applied in a layer of uniform thickness. In a repaving operation, the new asphalt material may be laid upon the old surface of the roadway. It has been found that the new asphalt material adheres to the old road surface much better when the old road surface is warm. Poor results are obtained when the new asphalt material is applied upon a cold roadway. For this reason, specific temperature conditions exist under which paving must occur to ensure pavement quality. This limits the length of the paving season and the productivity on days when paving crews must wait for the temperature to rise.

A screed assembly typically includes a base portion and may include one or more extension portions, each of these portions having steel screed plates mounted to the screed portions in such a manner that the plates both smooth and compress the deposited paving material, leaving behind a mat of the desired thickness. The screed plates are typically heated to prevent the asphalt material from clinging to the steel plates. In modern screed assemblies, the screed plate heaters are commonly implemented in the form of resistive electrical heaters that can be optimally positioned on or near the screed plates. Screed plates may also be heated by gas or other combustible fuel heaters. It is important to maintain a proper screed plate temperature. If the screed plates are either too hot or too cold, a poor finish will be obtained in the resulting pavement mat. In a simple screed having only base screed portions, each of the base screed portions typically includes both a heater and a temperature sensor. In such a system, each of the base screed plates may be individually temperature controlled according to feedback received from the associated temperature sensor. A wider screed requires more heaters, and the heaters are generally arranged into independent heating zones. Electric power to the heaters is controlled by a screed power module (SPM). During the paving process it is important to identify the location of any faulty heating elements as quickly as possible to avoid wasting asphalt material. If particular heating elements fail, asphalt may stick to the screed in the area that is allowed to cool, wasting material and resulting in a mat of asphalt that is not of the desired quality and uniformity.

During operation of a paving screed, an undesirable situation arises when the insulation or other portion of an energized heating element fails and the electrical source is shorted or leaks current to the housing of the chassis of the paving machine. In addition to potentially causing the failure of a heating element and the resulting waste of asphalt material described above, damage to the paving machine or systems or other potentially hazardous situations may result. As a result, there is a need to identify the location of a faulty heating element amongst the many heating elements present, and perform the necessary repairs in response thereto. A wider screed may exacerbate this problem as a result of the additional zones and heaters needed to heat the additional area of base screed plates.

One method of detecting faults in an electrical circuit is described in U.S. Pat. No. 5,574,346 issued to Chavan et al. on Nov. 12, 1996 (the '346 patent). A winding fault detection circuit monitors voltage drops in the phase windings of a motor and compares the voltage drops with reference voltages to determine if the motor is out of normal operating range parameters and if a valid fault exists. If a valid fault exists, a circuit driving the motor is interrupted.

Although the fault detection circuit of the '346 patent may interrupt operation when a winding fault is detected, it may be overly complex, costly, and difficult to implement. For example, the fault detection circuit requires comparator logic to monitor the windings of each phase of the motor and to compare the voltage drops across each winding to a high reference voltage and a low reference voltage. In addition, the outputs of the comparator logic must be sequentially selected and provided to fault logic in accordance with the excitation of respective phase windings and the angular position of the motor. Only at this point may analysis be made as to whether a winding fault is present.

The present disclosure is directed to overcoming one or more of the problems set forth above and/or other problems with existing technology.

SUMMARY OF THE INVENTION

One aspect of the disclosure is directed to a fault detection system for a machine having a plurality of electrical conducting elements insulated from a frame ground of the machine. The system may include a high voltage circuit including a high voltage DC power source, a positive high voltage bus connected to a positive terminal of the high voltage DC power source and providing high voltage electrical power to the plurality of electrical conducting elements, and a negative high voltage bus connected to a negative terminal of the high voltage DC power source and returning high voltage electrical power from the plurality of electrical conducting elements. At least one of the positive high voltage bus and the negative high voltage bus may be configured to be selectively connected through a plurality of switches to plural zones containing subsets of the plurality of electrical conducting elements, with each of the plural zones being electrically connected in parallel to the high voltage circuit, and selectively connected to the high voltage DC power source by one of the plurality of switches. A first low voltage DC power source may be configured to form part of a leakage current detector, and the leakage current detector may be configured to be selectively connected through each of the plurality of switches to each of the plural zones for detecting leakage current between an electrical conducting element contained within the zone and the frame ground.

Another aspect of the disclosure is directed to a method of detecting a fault amongst a plurality of electrical conducting elements connected in a high voltage electrical circuit to one of a positive high voltage power bus or a negative high voltage power bus providing high voltage power from a high voltage power source. The plurality of electrical conducting elements may include a plurality of subsets of the electrical conducting elements connected in parallel to the high voltage electrical circuit in a plurality of independent zones, with each of the independent zones being selectively connected to the high voltage power source by a zone switch. The method may include turning off the high voltage power source, disconnecting all of the independent zones of electrical conducting elements using their respective zone switches, turning on a low voltage diagnostic power supply selectively connected to at least one of the positive high voltage power bus or the negative high voltage power bus, and performing a low voltage diagnostic test on the high voltage electrical circuit by measuring leakage current from any electrical conducting element connected to the same high voltage power bus as the low voltage diagnostic power supply. The method may further include performing a low voltage diagnostic test on each of the plurality of independent zones by successively operating each zone switch to connect each independent zone and measuring leakage current from each successive independent zone. Low voltage diagnostic tests may also be performed successively on each of the electrical conducting elements within each of the independent zones determined to contain a fault.

DETAILED DESCRIPTION

Figure 1:
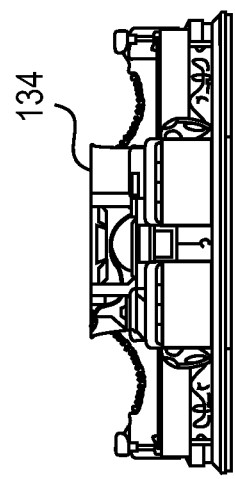
FIG. 1 shows a diagrammatic and schematic representation of an exemplary paving screed and screed power module.
Figure 1:
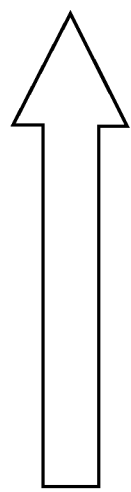
Figure 1:
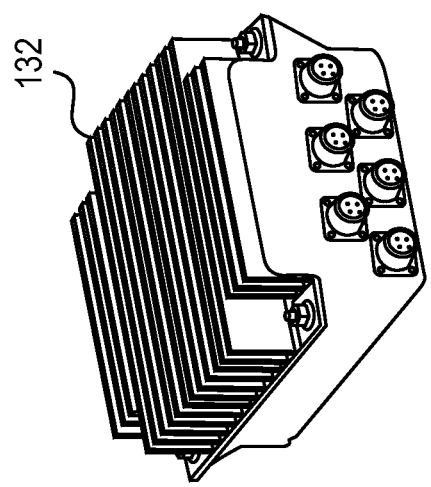

FIG. 1 illustrates portions of an exemplary paving machine. The only portions of the paving machine shown in FIG. 1 are the screed 134 and a screed power module (SPM) 132 that may control the supply of electric power to a plurality of independent heating zones on screed 134. Each of the independent heating zones may include a plurality of heating elements 34. Electric power to the independent heating zones on screed 134 may be controlled by SPM 132. In one non-limiting implementation, screed 134 may have 12 zones of 3 heating elements 34 each.

Figure 2:
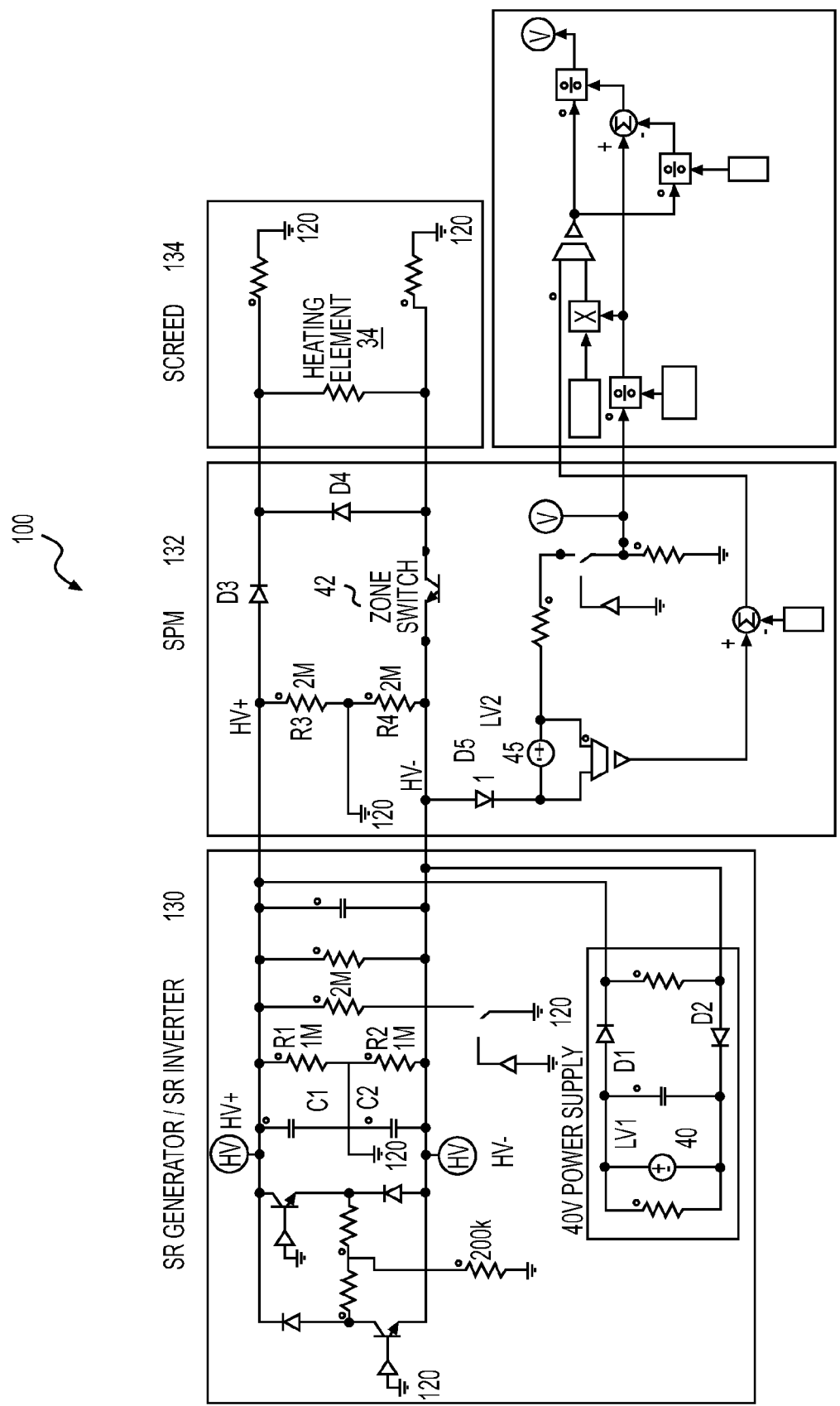
FIG. 2 shows an exemplary circuit diagram for an electrical fault locating system associated with the screed power module of FIG. 1.
Figure 2A:
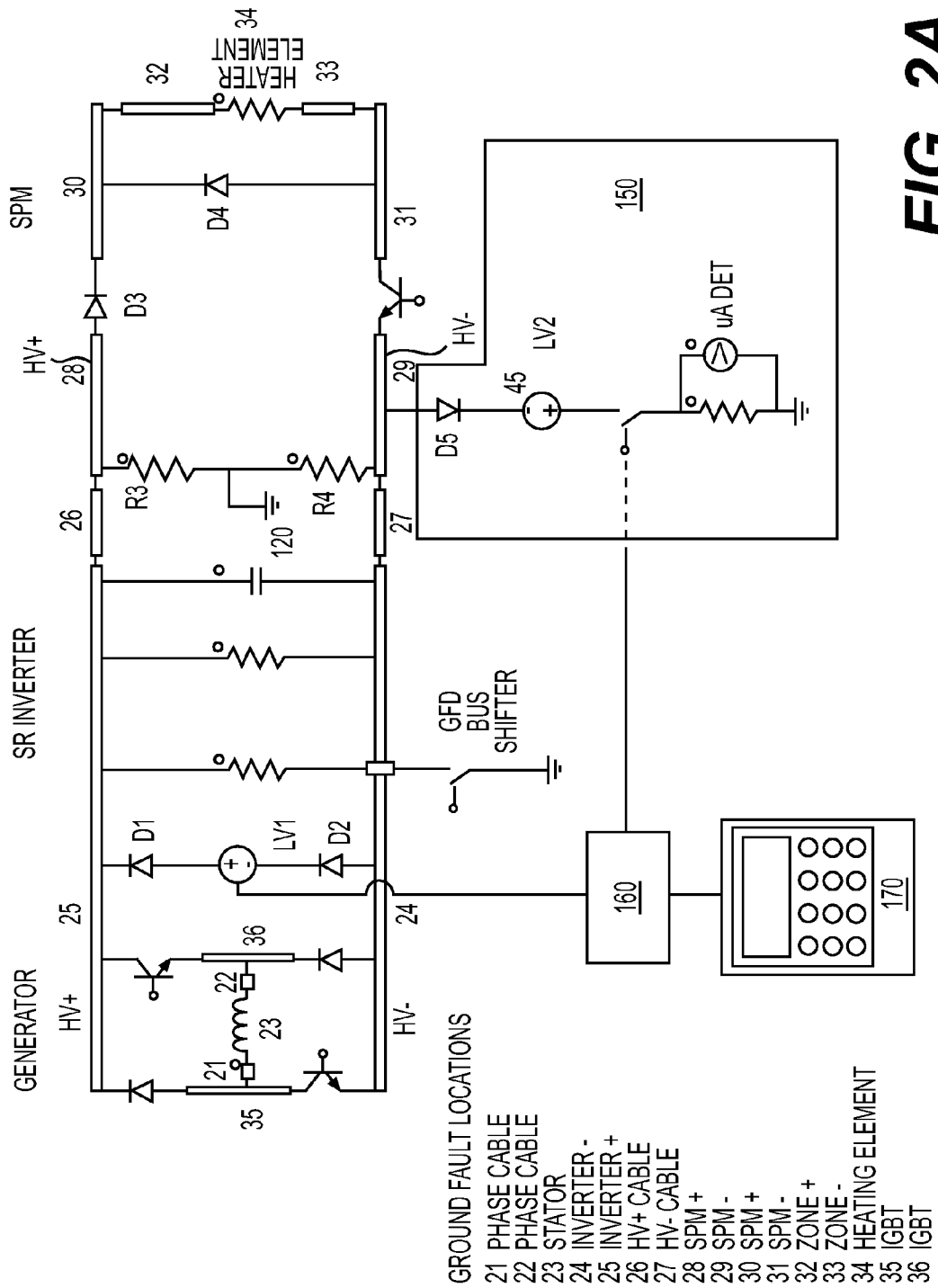
FIG. 2A shows an exemplary circuit diagram of a portion of the circuit diagram shown in FIG. 2, with potential fault locations highlighted.

As shown in FIGS. 2 and 2A, a leakage current detection system 100 according to an implementation of this disclosure may include a switched reluctance (SR) direct current (DC) generator and SR inverter 130, screed power module (SPM) 132, and screed 134. DC power may be chosen for a number of reasons, and the use of a SR generator and inverter may enable significant cost savings over AC power generation. Leakage current detection system 100 may include a high voltage electrical circuit for providing high voltage power (HV) from SR generator/inverter 130 to SPM 132 and to the plurality of heating elements 34 used to heat the base screed plates of paving screed 134. In alternative implementations, high voltage power (HV) may be provided by a battery, or any other suitable power source. In one implementation, the high voltage power source may provide approximately 675 volts DC. The high voltage electrical circuit may include a positive high voltage bus HV+ connected to the positive terminal of high voltage power supply HV, and a negative high voltage bus HV− connected to the negative terminal of high voltage power supply HV.

As shown in FIG. 2A, the high voltage circuit may include a plurality of electrical conducting elements interconnected along positive high voltage bus HV+ and negative high voltage bus HV−. Each of the electrical conducting elements may include one or more electrical connectors at each end of the conducting element and/or at the ends and various intermediate points along the electrical conducting elements. The electrical connectors may break the high voltage circuit into sections that can be easily replaced. They may also form part of the leakage current detection system 100 by providing a mechanism for isolating portions of the high voltage circuit to locate faults. Faults may include areas of deteriorating electrical insulation or other material or structural faults that may lead to current leaking from an electrical conducting element to a frame ground of the machine in amounts exceeding a threshold. When resistance to the current leakage is very high, such as 1000 M ohms, there may be only a negligible amount of current leakage. Therefore, a threshold level of resistance to current leakage may be selected as a level of resistance below which the amount of current leakage is considered to be a fault, and a warning indicator may be provided on an operator panel 170. A first threshold value for resistance to current leakage at which a leakage current detector may be configured to issue a notification to an operator may be lower than a second threshold value that the leakage current detector is capable of measuring. For example, in one non-limiting example, the leakage current detector may issue a notification to an operator when a resistance to leakage current falls below 150,000 ohms. However, the leakage current detector may be sensitive enough to actually measure the smaller amount of leakage current that would be present when the resistance to leakage current has only fallen below 300,000 ohms, but has not yet reached the level of 150,000 ohms at which a notification would be sent to an operator. This ensures that whenever an alarm or notification has been received, the leakage current detector will be sensitive enough to actually measure the amount of current leakage that may be caused by changing conditions of voltage, moisture, contaminant, temperature, insulation degradation, vibration, or other leakage influencing factors.

Exemplary interconnections of various portions of the high voltage circuit are shown in FIG. 2A. As mentioned above, electrical connectors may be provided at each end of the illustrated sections of the high voltage circuit in order to provide a means for replacing faulted electrical conducting elements, and a means for locating a fault in the electrical circuit. Ground fault locations illustrated in FIG. 2A are exemplary possible locations for current leakage from an electrical conducting element to a frame ground, and other locations or arrangements of electrical conducting elements may be employed. The SR generator/inverter 130 may include electrical conducting elements such as a phase cable 21, phase cable 22, and a stator 23. The SR generator/inverter may also include insulated gate bipolar transistors (IGBT) 35, 36, or other suitable semiconductor switches. SR generator/inverter 130 may include a negative high voltage electrical conducting element 24 (labeled inverter− in the legend of ground fault locations), a positive high voltage electrical conducting element 25 (inverter+), another section of positive high voltage cable 26 (HV+ cable), and another section of negative high voltage cable 27 (HV− cable). Screed power module (SPM) 132 may include sections of positive high voltage electrical conducting elements 28, 30 (labeled SPM+), and sections of negative high voltage electrical conducting elements 29, 31 (labeled SPM−).

As shown in FIGS. 2 and 2A, the negative high voltage bus HV−, including inverter− 24, HV− cable 27, and SPM− 29, 31, may be configured to selectively connect through a plurality of zone switches 42 to plural parallel zones that may each contain subsets of electrical conducting elements. A subset of electrical conducting elements in each zone may include one or more elements. In FIG. 2A, only one of the plural parallel zones is shown. The plural zones may each be connected in parallel to the high voltage electrical circuit at a respective zone switch 42 on the negative high voltage bus HV−, and at a respective diode D3 on the positive high voltage bus HV+. The illustrated zone in FIG. 2A may include electrical conducting elements SPM− 31, zone− 33, a heating element 34, zone+ 32 and SPM+ 30. One of ordinary skill in the art will recognize that the exact arrangement and number of electrical conducting elements could be varied. The illustrated zone may be electrically connected in parallel with plural other zones. In one non-limiting implementation, 12 parallel zones with 3 heating elements 34 each may be provided. Each zone may be selectively connected to the high voltage electrical circuit and high voltage power source by a separate zone switch 42, and isolated from each other parallel zone by diodes D3 (one of which is shown in FIG. 2A) between SPM+ 28 and SPM+ 30 on the positive high voltage bus HV+. Each diode D3 may prevent current in its respective zone from entering another zone during the leakage current measurement. One of ordinary skill in the art will recognize that alternative implementations may include providing zone switches 42 on the positive high voltage bus HV+ and diodes D3 on the negative high voltage bus HV−, or other circuit components to selectively achieve connection and disconnection, and isolation of each of the plural parallel zones of electrical conducting elements.

Leakage current detection system 100 may also include voltage divider circuits including resistors R1 and R2 of SR generator/inverter 130 (shown in FIG. 2), and resistors R3 and R4 of SPM 132. The positive and negative high voltage buses (HV+ and HV−) may be resistively referenced to a frame ground 120 by resistors R1 and R2 in SR generator/inverter 130 and resistors R3 and R4 in SPM 132. The values of 1 megaohm for each of resistors R1 and R2, and 2 megaohms for each of resistors R3 and R4, illustrated in FIG. 2, are exemplary and may include other values consistent with achieving the objectives of various implementations. The values of these resistances may be chosen as large enough resistances to maintain a balanced condition across positive and negative high voltage buses HV+ and HV− under normal conditions when no faults such as leakage current in excess of a threshold are present. When the high voltage circuit of leakage current detection system 100 is balanced (e.g., in a balanced condition), the positive and negative high voltage buses (HV+ and HV−) are centered equally around frame ground 120. When the high voltage circuit of leakage current detection system 100 is unbalanced (or in an unbalanced condition), the positive and negative high voltage buses (HV+ and HV−) are not centered around frame ground 120.

Leakage current detection system 100 may further include capacitors C1 and C2. Capacitors C1 and C2 may be any suitable type of capacitor known in the art, such as film or electrolytic capacitors. Capacitors C1 and C2 may serve the purpose of AC referencing electrical system 100 to frame ground 120. Capacitors C1 and C2 may represent the equivalent frame reference capacitance of electrical system 100 and high voltage power source HV.

Leakage current detection system 100 may also include a first low voltage power source LV1. First low voltage power source LV1 may be a generator, a battery, or any other suitable power source. First low voltage power source LV1 may operate independently of high voltage power source HV, and may be isolated from the high voltage power source HV by diodes D1, D2. First low voltage power source LV1 may be connected between the positive and negative high voltage buses HV+ and HV− and referenced to frame ground 120 by resistors R1 and R2, which act as two balancing resistors connected in series to form a voltage divider between the positive and negative high voltage buses. Throughout this application, high and low are referenced as relative terms, rather than denoting any specific range or ranges. Resistors R1 and R2 may be any suitable type of resistor known in the art, such as a metal film resistor or a wirewound resistor. First low voltage power source LV1 may also be resistively referenced to frame ground 120 by balancing resistors R3 and R4 located further electrically downstream in SPM 132, causing a low voltage balanced condition when no faults or current leakage in excess of a threshold is present in the high voltage electrical circuit.

When the high voltage electrical circuit of leakage current detection system 100 is balanced, first low voltage power source LV1 may be centered around frame ground 120. For example, low voltage power source LV1 may be a 40 volt power supply. When the high voltage electrical circuit is balanced, and high voltage power source HV is turned off for performance of a low voltage diagnostics test on the high voltage electrical circuit, positive high voltage bus HV+ may be +20 volts and negative voltage bus HV− may be −20 volts. When the high voltage electrical circuit of leakage current detection system 100 is unbalanced (or in an unbalanced condition), first low voltage power source LV1 may not be centered around frame ground 120. In this unbalanced condition, positive high voltage bus HV+ may be +30 volts and negative high voltage bus HV− may be −10 volts, making the system unbalanced with respect to frame ground 120. The placement of first low voltage power source LV1 in an electrically centered position between positive high voltage bus HV+ and negative high voltage bus HV− may also allow low voltage power source LV1 to be configured to detect small current leakages on either the positive or negative sides of the high voltage electrical circuit as reflected in an unbalanced condition.

Leakage current detection system 100 may also include a second low voltage power source LV2 configured to form part of a leakage current detector 150 (illustrated in FIG. 2A). Diode D5 may be provided in association with leakage current detector 150 in order to isolate leakage current detector 150 from the high voltage power HV. FIG. 2A illustrates leakage current detector 150 as being connected to SPM− 29, which is part of the negative high voltage bus HV−. In various alternative implementations, leakage current detector 150 may be selectively connected to the positive high voltage bus HV+ for detecting leakage current from any electrical conducting element electrically connected to the positive high voltage bus, or connected to the negative high voltage bus for detecting leakage current from any electrical conducting element electrically connected to the negative high voltage bus.

Leakage current detection system 100 may also include a controller 160 configured to automatically and sequentially alternate between connecting the first low voltage DC power source LV1 to perform a first low voltage diagnostic test, and connecting the second low voltage DC power source LV2 to perform a second low voltage diagnostic test. The first low voltage diagnostic test may detect a low voltage unbalanced condition between positive high voltage bus HV+ and negative high voltage bus HV− referenced to frame ground 120. The second low voltage diagnostic test may determine leakage current between successive electrical conducting elements and frame ground 120. Controller 160 may be further configured to perform a computation during connection of the second low voltage DC power source for detecting leakage current, with the computation including subtracting current flowing through the two balancing resistors from the detected leakage current to improve the accuracy of measurement of actual leakage current from an electrical conducting element to frame ground 120. The computations to improve the accuracy of measurement of actual leakage current may also be performed by various discrete electrical circuit components or other hardware, or additional processors, subroutines, or other software that may provide input to controller 160.

An operator panel 170 may provide input devices such as test initiation buttons, a touch screen, levers, or switches that enable an operator to initiate the automatic and sequential low voltage diagnostic tests by activation of the input device on operator panel 170. Controller 160 may be configured to automatically sequence between the first and second low voltage diagnostic tests when initiated by an operator after one of the diagnostic tests has detected a fault such as leakage current in excess of a threshold for one of the plural parallel zones containing subsets of electrical conducting elements. This automatic sequencing may include opening only the zone switch for the faulted zone, and then performing the first and second low voltage diagnostic tests successively in conjunction with the disconnection of electrical connectors interposed between the electrical conducting elements to isolate one or more electrical conducting elements within the faulted zone. An operations and maintenance (O&M) manual may provide instructions to a mechanic on an appropriate order for disconnection of the electrical connectors interposed between the electrical conducting elements within a zone. For example, after a particular zone has been identified as having current leakage in excess of a threshold, the low voltage diagnostic test for identifying which electrical conducting element within the zone has the fault may include starting with disconnection of the electrical connector between diode D3 and electrical conducting element 30, turning off low voltage DC power source LV2, and checking for an unbalanced condition across the positive high voltage bus HV+ and the negative high voltage bus HV− using the first low voltage DC power source LV1. Disconnection and reconnection of electrical connectors between electrical conducting elements successively further downstream, with a repeat of the low voltage diagnostic test for unbalance in the high voltage electrical circuit, may provide an intuitive method of identifying exactly which electrical conducting element has the fault.

Controller 160 may be any type of programmable logic controller known in the art for automating machine processes. Controller 160 may be made from any material known in the art for logic devices, and may include a microprocessor, program memory, and pulse width modulation components. Controller 160 may include input/output arrangements that allow it to be connected to operator panel 170 and to first low voltage DC power source LV1 and second low voltage power source LV2. Operator panel 170 may be located at an operator's station (not shown) of the machine. Operator panel 170 may include multiple plastic or metal buttons, switches, levers, or other input devices. Alternatively or in addition, operator panel 170 may include a touch screen, and the touch screen may be any suitable digital display device known in the art for receiving input. Controller 160 may also be automated to perform various low voltage diagnostic tests by a timed sequence or commanded remotely by a data link signal from another machine controller or an electronic service/diagnostic tool. An operator may perform the disclosed testing methods at a low operating voltage after turning off the high voltage power source HV. Testing under low operating voltage conditions may be appropriate during servicing of leakage detection system 100 after a fault has been detected and has to be located and repaired. These low voltage diagnostic tests may also occur on start-up, prior to activation of high voltage power source HV by the operator. An operator may provide input to controller 160 through operator panel 170.

Exemplary methods for operating leakage current detection system 100 will be discussed in the following section. The exemplary methods, including the sequence of various operations and low voltage diagnostic tests that may be performed to find faulted zones (Service Test SST1), find faults within a faulted zone (SST2A), and find a faulty electrical conducting element such as a heating element within a zone will be discussed with reference to FIGS. 3-5 in order to further illustrate the concepts discussed above.

INDUSTRIAL APPLICABILITY

The disclosed exemplary system and methods for detecting a fault such as leakage current amongst a plurality of electrical conducting elements may provide a compact, intuitive, and effective system and method for finding faults within a high voltage electrical circuit having a large number of electrical conducting elements, including multiple heating elements arranged within plural parallel zones. The system may include a low voltage power source as part of a current leakage detector that may be selectively connected during low voltage diagnostic tests to plural parallel zones of the electrical conducting elements using the same switches that selectively provide high voltage power to the elements within each of the parallel zones during normal high voltage operations. Two separate low voltage diagnostic tests may be automatically sequenced in conjunction with selective connection and disconnection of electrical conducting elements within each zone to rapidly isolate and identify faulted elements amongst a large number of potentially faulted elements in a high voltage circuit.

The system according to various implementations of this disclosure allows for the detection of a fault amongst a plurality of electrical conducting elements in a high voltage circuit connected to a high voltage power source through positive and negative high voltage buses. The high voltage circuit may include plural zones containing subsets of the electrical conducting elements selectively connected in parallel to the high voltage electrical circuit through plural zone switches, with each zone switch associated with a respective zone. A service test for detecting leakage current somewhere in the high voltage electrical circuit may be initiated by shutting off the high voltage power supplied to the positive and negative high voltage buses during normal operations. After shutting off the high voltage power, all of the zone switches may be opened to isolate the plural parallel zones of electrical conducting elements from the rest of the high voltage electrical circuit.

A first low voltage power supply may be connected to the high voltage electrical circuit to check for leakage current from any electrical conducting element not in one of the plural zones. If the resistance to leakage current at this point is found to be greater than a threshold, indicating that no fault has been found, then the first low voltage power supply may be successively connected to each of the plural zones by closing respective ones of the zone switches associated with successive zones and checking for leakage current anywhere in a zone. If a zone is identified to have leakage current in excess of a threshold, electrical connectors interposed between electrical conducting elements within the zone may be successively disconnected, and the first low voltage power supply may be reconnected to check whether the leakage current is no longer in excess of the threshold. The process of connecting the low voltage power supply and opening and closing the zone switches may be controlled automatically by activation of an input device on operator panel 170 after particular electrical connectors within each faulted zone are manually disconnected or reconnected.

Figure 3:
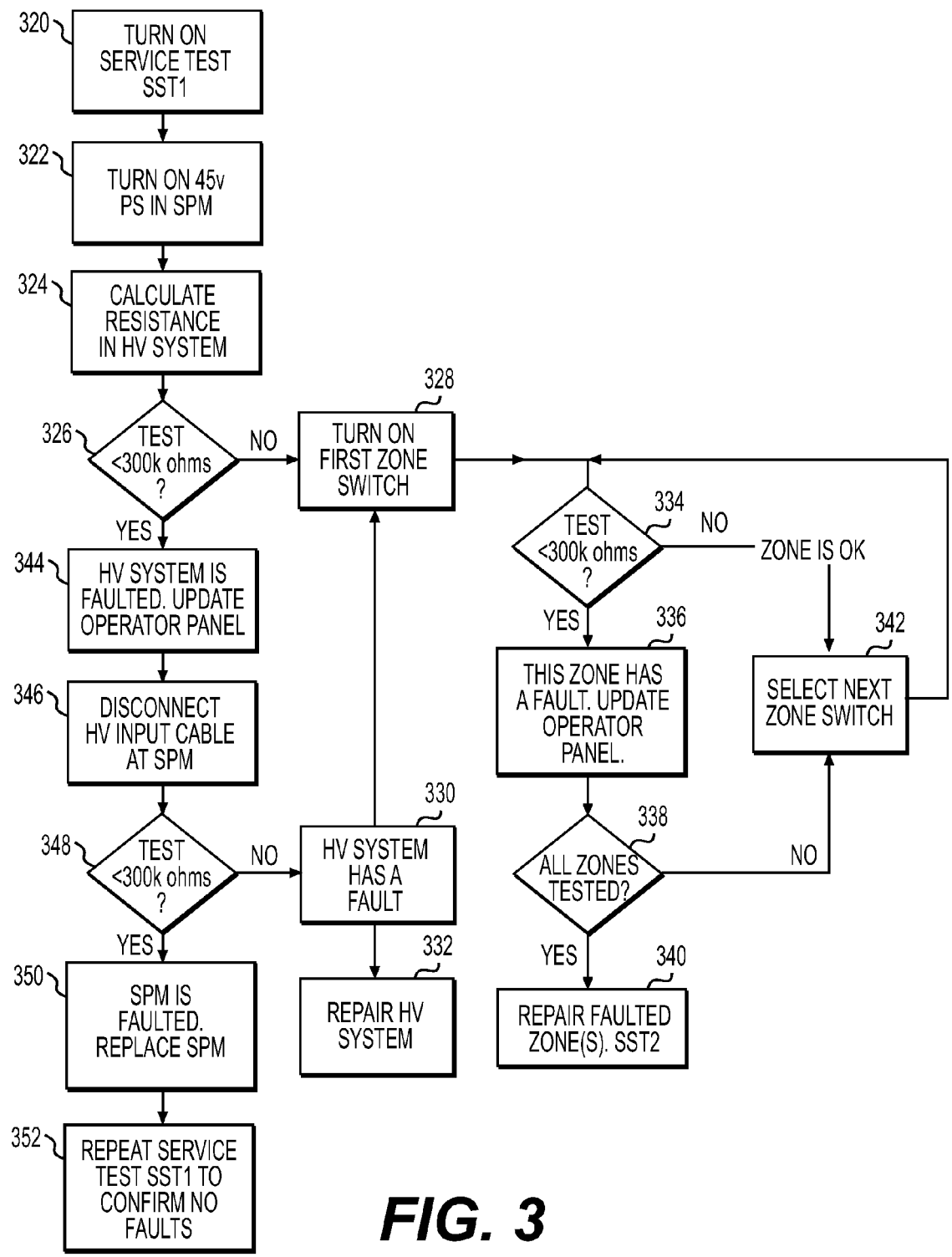
FIG. 3 is a flowchart of steps that may be performed by the system of FIG. 2 in detecting a faulted zone of electrical conducting elements.

Referring initially to FIG. 3, an exemplary test procedure SST1 is shown for finding a zone that may be faulted. A "faulted" zone may be a zone that includes at least one electrical conducting element that leaks current in excess of a threshold. Before starting this exemplary test procedure, controller 160 may be initialized for a service test. The machine being tested may be in a stopped and secured condition, the engine and generator may be off so that no high voltage power is being supplied to the high voltage electrical system, both low voltage power supplies LV1 and LV2 may be turned off, and all of the zone switches 42 may be opened to isolate each of the zones from the rest of the high voltage electrical circuit.

At step 320, service test SST1 for finding a faulted zone may be commenced. With all of the zone switches 42 opened, the first portion of this diagnostic test may be identifying faults within portions of the high voltage circuit that include the SR generator/inverter 130, and the screed power module (SPM) 132. Examples of potential ground fault locations being tested at this point in the service test may include any of the ground fault locations identified in the legend of FIG. 2A as 21-29, or 35-36.

At step 322, low voltage power supply LV2, which is part of leakage current detector 150 in SPM 132 may be turned on. In the exemplary implementation illustrated in FIG. 3, LV2 is chosen to be a 45 volt (V) power supply (PS) located within or associated with SPM 132. Alternative implementations may include other voltages for LV2, and LV2 and leakage current detector 150 may be connected at other positions along the high voltage electrical circuit. At step 324, the resistance to leakage current is calculated for any electrical conducting element in the high voltage (HV) circuit not including the elements within the isolated zones. The electrical conducting elements within each of the parallel zones may be isolated at this point in the low voltage diagnostic test as a result of all zone switches being opened. In the exemplary implementation illustrated in FIG. 3, LV2 is indicated to be a 45 V power supply (PS), although other values may be chosen. At step 326, the test performs a comparison to determine whether the calculated resistance to leakage current is less than a threshold of 300 k ohms. If the resistance to leakage current is less than 300 k ohms (step 326: Yes), this indicates an unacceptable level of leakage current. At step 344 a determination is made that one of the ground fault locations discussed above has a fault, and operator panel 170 is updated to display this information. The precise location of the fault may be further pursued at step 346 by disconnecting the HV input cable at SPM 132. The leakage current test is again performed at step 348, and if the test indicates acceptable levels of leakage current at this point (step 348: No), the fault has been isolated to portions of the HV system other than the SPM at step 330. The appropriate portions of the HV system may be repaired at step 332. If the test performed at step 348 indicates unacceptable levels of leakage current (step 348: Yes), then the fault is known to be within the SPM, and the SPM may be replaced or repaired at step 350. At step 352, the service test SST1 may be repeated to confirm that faults have been eliminated.

If the test performed at step 326 determines that the level of leakage current is acceptable since the resistance to leakage current is not less than the exemplary threshold of 300 k ohms (step 326: No), then the testing of each of the isolated zones may be commenced. At step 328, the first zone switch may be turned on to provide low voltage power from LV2 (45V PS in this exemplary implementation) to the electrical conducting elements within the first zone. As shown in FIG. 2A, these electrical conducting elements and potential ground fault locations include the elements labeled 30-34, including one or more heating elements 34. As discussed above, in various implementations there may be as many as 12 or more zones and zone switches, and each zone may include 1, 2, 3, or more heating elements 34.

At step 334, with a first zone switch turned on, the leakage current test is again performed using leakage current detector 150 and low voltage power supply LV2. If the amount of leakage current from this zone is acceptable (step 334: No), the next zone switch may be turned on at step 342. As discussed above, each time low voltage is applied to a zone by opening that zone switch, the low voltage is prevented from flowing into any other zone by the diodes D3 associated with each zone. If the amount of leakage current from this zone is unacceptable (step 334: Yes), the zone is identified as having a fault at step 336 and the operator panel may be updated. If all zones have not yet been tested (step 338: No), the next zone switch may be turned on at step 342, and the leakage current test may be performed again at step 334. If all zones have been tested (step 338: Yes), the faulted zone(s) may receive further testing and repair at step 340 by proceeding to the service test SST2A shown in FIG. 4 for finding the fault within the faulted zone. All zone switches may once again be turned off, isolating all parallel zones from the rest of the high voltage circuit, before proceeding to the service test SST2A of FIG. 4.

Figure 4:
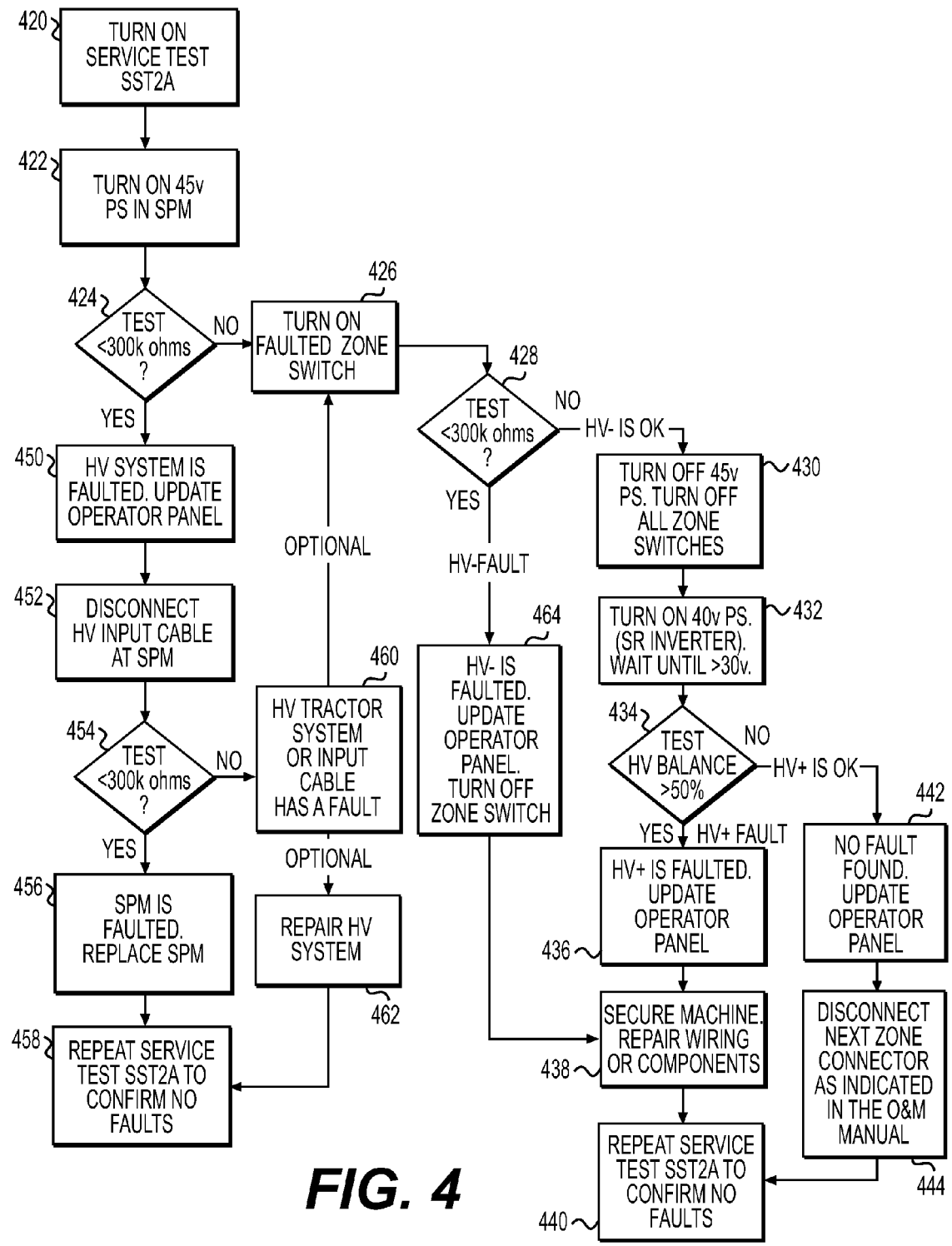
FIG. 4 is a flowchart of steps that may be performed by the system of FIG. 2 in detecting a fault within a faulted zone of electrical conducting elements.

If a zone has been determined to have a fault after performing service test SST1 of FIG. 3, a service test SST2A may be performed to find the fault within the zone, as shown in FIG. 4. At step 420, the service test SST2A for finding a fault within a faulted zone may be commenced. The low voltage power supply LV2 (45V PS in the SPM in this exemplary implementation) may be turned on at step 422. The leakage current test for all electrical conducting elements outside of the zones may be performed again at step 424 to determine whether the leakage current for any of these potential ground fault locations is still acceptable. If the leakage current is unacceptable at this point before having turned on the faulted zone switch (step 424: Yes) then the same steps as performed above for SST1 to find a faulted zone (steps 344, 346, 348, 350, 352, 330, and 332) may be repeated at steps 450, 452, 454, 456, 458, 460, and 462. These steps may be taken again in order to isolate a fault within any of the electrical conducting elements outside of the parallel zones, such as electrical conducting elements in SR generator/inverter 130, or SPM 132.

At step 424, if the leakage current is acceptable at this point before having turned on the faulted zone switch (step 424: No), the zone switch for the zone previously determined to have a fault may be turned on at step 426. The leakage current test using leakage current detector 150 and low voltage power supply LV2 may be performed at step 428. If leakage current is unacceptable at this point (step 428: Yes), the fault has been determined to be present somewhere in the negative high voltage bus HV− for implementations where leakage current detector 150 is selectively connected to HV−, as shown in FIG. 2A. The operator panel may be updated at step 464 to reflect the finding of a fault in HV−, the zone switches may be turned off, and repairs to wiring or components may be performed at step 438. In alternative implementations, leakage current detector 150 may be selectively connected to the positive high voltage bus HV+, and in those alternative implementations an unacceptable leakage current at step 428 would indicate a fault somewhere in the positive high voltage bus HV+.

If the test performed at step 428 indicates an acceptable leakage current (step 428: No), but the zone was previously determined to have a fault, then further testing may be required using the low voltage power supply LV1, which may be connected in SR generator/inverter 130 between the positive and negative high voltage buses HV+ and HV− and referenced to frame ground 120 by resistors R1 and R2, as discussed above. The low voltage power supply LV2 may be turned off at step 430, along with all of the zone switches. Low voltage power supply LV1 may then be turned on at step 432, and a check of the balance across HV+ and HV− may be performed at step 434. As discussed above, a balanced condition (step 434: No) would indicate that no fault has been found on the HV+ side of the high voltage electrical circuit since zone switches on the HV− side of the circuit are turned off. This determination at step 442 may result in an update of the operator panel to reflect that no fault has been found. Since no fault has yet been found in the zone previously determined to have a fault, step 444 may be performed to successively disconnect other electrical connectors within the faulted zone, in an order specified in the operations and maintenance (O&M) manual. Controller 160 may automatically successively alternate between performing a low voltage diagnostic test using LV2 (using the 45V PS in the exemplary illustrated implementation), turning on a faulted zone switch, turning off LV2, and performing another low voltage diagnostic test using LV1 (using the 40V PS) after each successive electrical connector in the faulted zone is disconnected. An unbalanced condition (step 434: Yes) would indicate that a fault does exist on the HV+ side of the circuit, and so the operator panel may be updated at step 436, wiring may be repaired where necessary at step 438, and the service test SST2A for finding a fault within a zone may be repeated at step 440.

In one exemplary implementation illustrating the application of steps 430-444 in FIG. 4, zone switch 42 to a faulted zone may be on and leakage current detector 150 with low voltage power supply LV2 may be failing to show any leakage current (step 428: No). In this example, the fault may be located in the faulted zone at electrical conducting element 32. By turning off LV2 (the 45 V PS) and all zone switches 42 at step 430, and turning on low voltage power supply LV1 (the 40 V PS) at step 432, leakage current detection system 100 may then test for an unbalanced condition in the high voltage electrical circuit. Instructions may be provided specifying that an electrical connector on the downstream side of heating element 34 between the heating element 34 and electrical conducting element 33 be disconnected. If the unbalanced condition is still detected by LV1, then this indicates that the fault must be in the heating element 34, or somewhere upstream of heating element 34 within the faulted zone. Instructions may direct the disconnection of an electrical connector on the upstream side of heating element 34, between electrical conducting element 32 and heating element 34. At this point, if the unbalanced condition still exists, it is known that the unbalance was not caused by heating element 34 or any electrical conducting elements downstream of heating element 34. If subsequent disconnection of an electrical connector between electrical conducting elements 30 and 32 results in the unbalanced condition going away, then it is known that the fault must lie within electrical conducting element 32. The method therefore provides an intuitive way of eliminating electrical conducting elements as being the source of the fault within a faulted zone by disconnecting an electrical connector just upstream of each element and determining whether the fault goes away.

Figure 5:
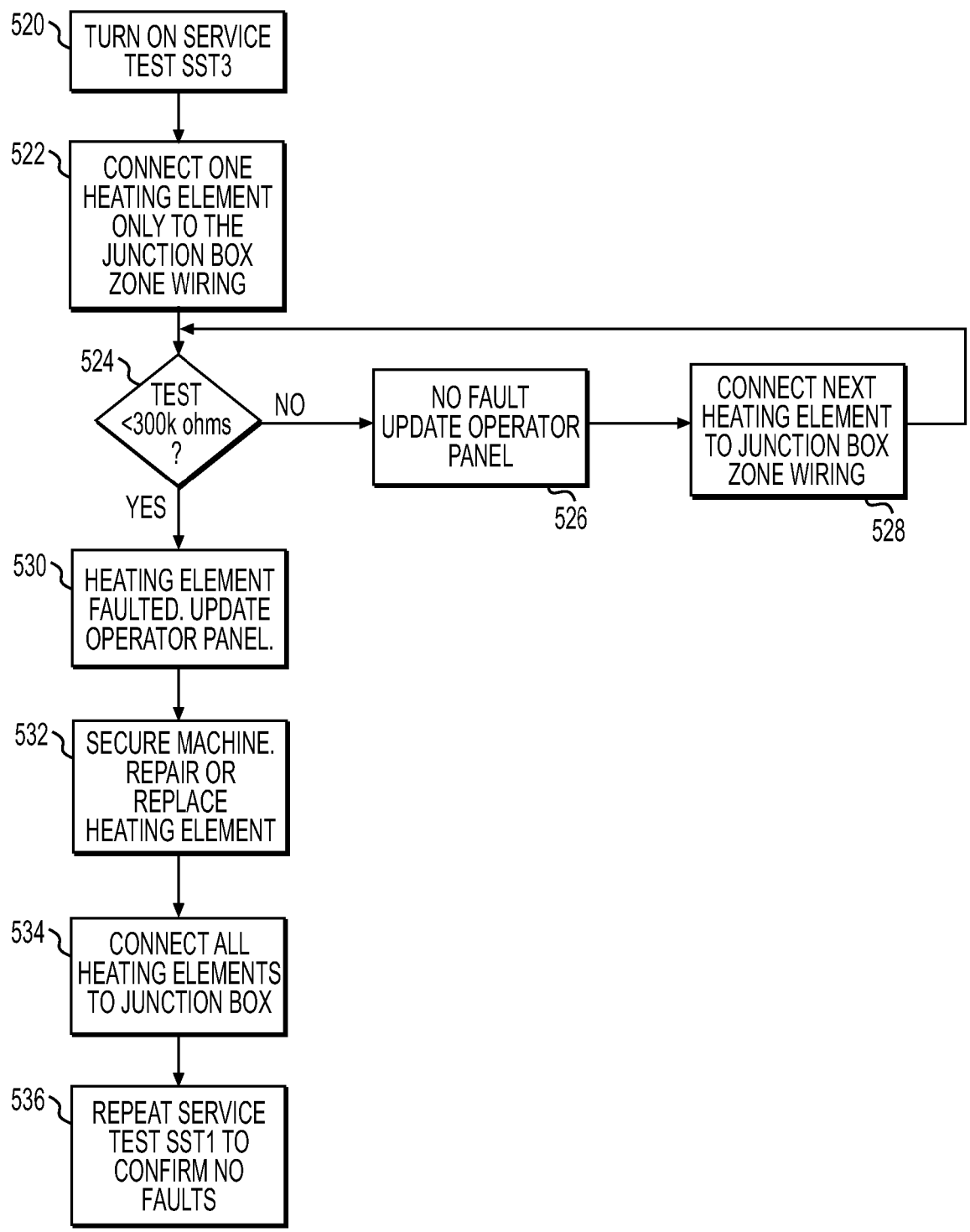
FIG. 5 is a flowchart of steps that may be performed by the system of FIG. 2 in detecting a faulted electrical conducting element within a faulted zone of electrical conducting elements.

After the service test SST2A of FIG. 4 has located a fault within a faulted zone, in situations where there are multiple heating elements 34 connected in parallel within a single faulted zone, additional testing in accordance with service test SST3 of FIG. 5 may be required to find the faulted heating element. As shown in FIG. 5, this additional service test SST3 to find a faulted heating element within a faulted zone may be commenced at step 520. All of the heating elements 34 within the faulted zone may first be disconnected in accordance with procedures set forth in the operations and maintenance (O&M) manual. One heating element 34 may then be connected to junction box zone wiring at step 522, and a leakage current test may be performed by leakage current detector 150 and low voltage power supply LV2 at step 524. A determination that the level of leakage current is acceptable (step 524: No) may result in updating the operator panel to indicate no fault with that particular connected heating element 34 at step 526, proceeding to step 528 to connect the next heating element within the faulted zone to junction box zone wiring, and repeating the leakage current test at step 524. A determination that the level of leakage current is unacceptable (step 524: Yes) may result in an indication that the connected heating element is faulted, and an update of the operator panel at step 530. The machine may be secured and the faulted heating element may be repaired or replaced at step 532. After the last of the heating elements has been connected and tested, all of the heating elements in the zone may be connected to the junction box at step 534, and the service test SST1 for finding a faulted zone may be repeated to confirm that there are no longer any faults at step 536.

It will be apparent to those skilled in the art that various modifications and variations can be made to the disclosed fault detection system without departing from the scope of the disclosure. Other embodiments of the fault detection system will be apparent to those skilled in the art from consideration of the specification and practice of the methods disclosed herein. It is intended that the specification and examples be considered as exemplary only, with a true scope of the disclosure being indicated by the following claims and their equivalents.

What is claimed is:

1. A fault detection system for a machine having a plurality of electrical conducting elements insulated from a frame ground of the machine, the system comprising:
a high voltage circuit including a high voltage DC power source;
a positive high voltage bus connected to a positive terminal of the high voltage DC power source and providing high voltage electrical power to the plurality of electrical conducting elements;
a negative high voltage bus connected to a negative terminal of the high voltage DC power source and returning high voltage electrical power from the plurality of electrical conducting elements;

at least one of the positive high voltage bus and the negative high voltage bus configured to be selectively connected through a plurality of switches to plural parallel zones containing subsets of the plurality of electrical conducting elements, with each of the plural parallel zones being electrically connected in parallel to the high voltage circuit, and selectively connected to the high voltage DC power source by one of the plurality of switches;

a first low voltage DC power source configured to form part of a leakage current detector, the leakage current detector configured to be selectively connected through each of the plurality of switches to each of the plural parallel zones for detecting leakage current between an electrical conducting element contained within the zone and the frame ground; and a second low voltage DC power source configured to be isolated from the high voltage DC power source and connected between the positive and negative high voltage buses and referenced to the frame ground by two balancing resistors connected in series to form a voltage divider between the positive and negative high voltage buses, and the second low voltage DC power source being further configured to be used in a low voltage diagnostic test to detect a low voltage unbalanced condition between the positive high voltage bus and the negative high voltage bus with respect to the frame ground when a leakage current from one of the electrical conducting elements to the frame ground exceeds a threshold.

2. The fault detection system of claim 1, further including:
the leakage current detector being further configured to be selectively connected to the positive high voltage bus for detecting leakage current from any electrical conducting element electrically connected to the positive high voltage bus, or selectively connected to the negative high voltage bus for detecting leakage current from any electrical conducting element electrically connected to the negative high voltage bus.

3. The fault detection system of claim 1, further including:
a controller configured to automatically and sequentially alternate between connecting the first low voltage DC power source for detecting leakage current, and connecting the second low voltage DC power source for detecting a low voltage unbalanced condition in order to determine the location of a fault associated with one or more of the plurality of electrical conducting elements.

4. The fault detection system of claim 3, further including:
an operator panel including a test initiation button configured for activating the controller; and
the controller further configured to perform a computation during connection of the first low voltage DC power source for detecting leakage current, the computation including subtracting current flowing through the two balancing resistors from the detected leakage current to improve accuracy of measurement of actual leakage current from an electrical conducting element to the frame ground.

5. The fault detection system of claim 1, wherein:
the high voltage DC power source includes a switched reluctance generator and a switched reluctance inverter; and
the plurality of electrical conducting elements receiving high voltage DC power from the high voltage DC power source include electrical conducting elements in the switched reluctance generator and switched reluctance inverter, a plurality of heating elements in each of the plural zones, and electrical conducting elements in a power module configured to control the supply of high voltage DC power to each of the plurality of heating elements in each of the plural zones.

6. The fault detection system of claim 5, wherein the first low voltage DC power source is included in the power module.

7. The fault detection system of claim 1, wherein the leakage current detector is configured to detect leakage current by comparing resistance to current leaking from an electrical conducting element to the frame ground with a threshold value.

8. The fault detection system of claim 7, wherein a first threshold value at which the leakage current detector is configured to issue a notification to an operator is lower than a second threshold value which the leakage current detector is capable of measuring.

9. The fault detection system of claim 8, wherein the first threshold value is approximately 150,000 ohms resistance to leakage current flow from an electrical conducting element to the frame ground, and the second threshold value is approximately 300,000 ohms resistance to leakage current flow from the electrical conducting element to the frame ground.

10. A method of detecting a fault amongst a plurality of electrical conducting elements connected in a high voltage electrical circuit to one of a positive high voltage power bus or a negative high voltage power bus providing high voltage power from a high voltage power source, the plurality of electrical conducting elements including a plurality of subsets of the electrical conducting elements connected in parallel to the high voltage electrical circuit in a plurality of independent zones, each of the independent zones being selectively connected to the high voltage power source by a zone switch, the method comprising:

turning off the high voltage power source;
disconnecting all of the independent zones of electrical conducting elements using their respective zone switches;
turning on a low voltage diagnostic power supply selectively connected to at least one of the positive high voltage power bus or the negative high voltage power bus;
performing a low voltage diagnostic test on the high voltage electrical circuit by measuring leakage current from any electrical conducting element connected to the same high voltage power bus as the low voltage diagnostic power supply;
performing a low voltage diagnostic test on each of the plurality of independent zones by successively operating each zone switch to connect each independent zone and measuring leakage current from each successive independent zone; and
performing low voltage diagnostic tests successively on each of the electrical conducting elements within each of the independent zones determined to contain a fault, and successively alternating between a low voltage diagnostic test to determine a low voltage unbalance across the positive and negative high voltage power buses referenced to a ground and a low voltage diagnostic test to determine leakage current between the successive electrical conducting element and the ground.

11. The method according to claim 10, wherein performing a low voltage diagnostic test to measure leakage current from any electrical conducting element is initiated automatically by an operator activating a button on an operator panel.

12. The method according to claim 10, further including:
when the low voltage diagnostic test identifies a fault by measuring a leakage current that is greater than a threshold, disconnecting electrical connectors interposed between electrical conducting elements further electrically downstream or upstream in the high voltage electrical circuit and repeating the low voltage diagnostic test in order to isolate and identify a disconnected electrical conducting element or an electrical conducting element further downstream from the disconnected electrical conducting element as having a fault.

13. The method according to claim 12, wherein performing low voltage diagnostic tests successively on each of the electrical conducting elements within each of the independent zones determined to contain a fault further includes:

successively alternating between a low voltage diagnostic test to determine a low voltage unbalance across the positive and negative high voltage power buses referenced to a ground and a low voltage diagnostic test to determine leakage current between successive electrical conducting elements and the ground.

14. A method of detecting a faulty electrical conducting element amongst a plurality of electrical conducting elements in a high voltage electrical circuit connected to a high voltage power source through positive and negative high voltage buses, the high voltage electrical circuit including plural zones containing subsets of the electrical conducting elements selectively connected in parallel to the high voltage electrical circuit through plural zone switches, each zone switch associated with a respective zone, the method comprising:

initiating a service test by shutting off the high voltage power supplied to the positive and negative high voltage buses and opening all of the zone switches to isolate the plural zones of electrical conducting elements from the high voltage electrical circuit;

connecting a first low voltage power supply to the high voltage electrical circuit to check for leakage current from any electrical conducting element not in one of the plural zones;

successively connecting the first low voltage power supply to each of the plural zones by closing respective ones of the zone switches associated with successive zones and checking for leakage current from anywhere in a zone;

when a zone is identified to have leakage current in excess of a threshold, disconnecting electrical connectors interposed between electrical conducting elements within the zone, and reconnecting the first low voltage power supply to check whether the leakage current is no longer in excess of the threshold; and successively alternating between connecting the first low voltage power supply to determine leakage current from the electrical conducting element and connecting a second low voltage power supply to determine a low voltage unbalance across the positive and negative high voltage buses referenced to a ground.

15. The method according to claim 14, wherein initiating a service test is performed automatically by an operator activating a button on an operator panel.

16. The method according to claim 14, further including:
when leakage current from an electrical conducting element is identified to be in excess of a threshold, disconnecting electrical connectors interposed between electrical conducting elements further downstream or further upstream in the high voltage electrical circuit from a previously disconnected electrical connector and rechecking for leakage current in order to isolate and identify a disconnected electrical conducting element or an electrical conducting element further downstream from the disconnected electrical conducting element as having a fault.

17. A paving machine, comprising:
a combustion engine configured to power operations of the paving machine;
a paving screed configured to receive asphalt and distribute the asphalt onto a surface, the paving screed including a screed power module and a plurality of heating elements arranged into a plurality of independent heating zones adapted to provide heat to the paving screed;
a generator coupled to receive a mechanical power input from the combustion engine, and provide high voltage DC electrical power output to a high voltage circuit including positive and negative high voltage DC power buses connected to the screed power module and selectively connected to the plurality of heating elements; and
a leakage current detection system including:
    at least one of the positive and negative high voltage DC power buses configured to be selectively connected through a plurality of switches to plural parallel zones, each zone containing a subset of the plurality of heating elements, with each of the plural parallel zones being electrically connected in parallel to the high voltage circuit, and selectively connected to the high voltage DC electrical power output by one of the plurality of switches;
    a first low voltage DC power source configured to form part of a leakage current detector, the leakage current detector configured to be selectively connected through each of the plurality of switches to each of the plural zones for detecting leakage current between an electrical conducting element contained within the zone and a frame ground; and
    a second low voltage DC power source configured to be isolated from the high voltage DC electrical power output and connected between the positive and negative high voltage DC power buses and referenced to the frame ground by two balancing resistors connected in series to form a voltage divider between the positive and negative high voltage buses, and the second low voltage DC power source being further configured to be used in a low voltage diagnostic test to detect a low voltage unbalanced condition between the positive high voltage bus and the negative high voltage bus with respect to the frame ground when a leakage current from one of the electrical conducting elements to the frame ground exceeds a threshold.

* * * * *